(12) United States Patent
Oka et al.

(10) Patent No.: US 8,076,223 B2
(45) Date of Patent: Dec. 13, 2011

(54) METHOD FOR PRODUCING SEMICONDUCTOR SUBSTRATE

(75) Inventors: Satoshi Oka, Annaka (JP); Nobuhiko Noto, Annaka (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 368 days.

(21) Appl. No.: 12/309,527

(22) PCT Filed: Jul. 4, 2007

(86) PCT No.: PCT/JP2007/063349
§ 371 (c)(1),
(2), (4) Date: Jan. 22, 2009

(87) PCT Pub. No.: WO2008/013032
PCT Pub. Date: Jan. 31, 2008

(65) Prior Publication Data
US 2009/0305485 A1 Dec. 10, 2009

(30) Foreign Application Priority Data
Jul. 25, 2006 (JP) .................. 2006-201485

(51) Int. Cl.
*H01L 21/20* (2006.01)
*H01L 21/205* (2006.01)
(52) U.S. Cl. .......... 438/503; 257/E21.102; 257/E21.103
(58) Field of Classification Search .................. 438/503; 257/E21.101, E21.103
See application file for complete search history.

(56) References Cited

U.S. PATENT DOCUMENTS

| 5,442,205 A | * | 8/1995 | Brasen et al. ................. 257/191 |
| 6,326,667 B1 | | 12/2001 | Sugiyama et al. |
| 6,703,293 B2 | * | 3/2004 | Tweet et al. ................... 438/518 |
| 6,900,143 B1 | * | 5/2005 | Pan et al. ....................... 438/752 |

(Continued)

FOREIGN PATENT DOCUMENTS
EP    2 091 074    *  8/2009
(Continued)

OTHER PUBLICATIONS

European Search Report issued in European Patent Application No. 07 76 8119 by the European Patent Office on Mar. 15, 2010.

(Continued)

*Primary Examiner* — Mary Wilczewski
(74) *Attorney, Agent, or Firm* — Oliff & Berridge, PLC (57) ABSTRACT

The present invention is a method for producing a semiconductor substrate, including steps of forming a SiGe gradient composition layer and a SiGe constant composition layer on a Si single crystal substrate, flattening a surface of the SiGe constant composition layer, removing a natural oxide film on the flattened surface of the SiGe constant composition layer, and forming a strained Si layer on the surface of the SiGe constant composition layer from which the natural oxide film has been removed, wherein the formation of the SiGe gradient composition layer and the formation of the SiGe constant composition layer are performed at a temperature $T_1$ that is higher than 800° C., the removal of the natural oxide film from the surface of the SiGe constant composition layer is performed in a reducing atmosphere through a heat treatment at a temperature $T_2$ that is equal to or higher than 800° C. and lower than the temperature $T_1$, and the formation of the strained Si layer is performed at a temperature $T_3$ that is lower than the temperature $T_1$. This method enables epitaxial growth of the strained Si layer on the flattened SiGe layer without degrading surface flatness of the SiGe layer.

9 Claims, 4 Drawing Sheets

U.S. PATENT DOCUMENTS

| | | | | |
|---|---|---|---|---|
| 7,108,748 | B2* | 9/2006 | Brabant et al. | 117/88 |
| 7,250,085 | B2* | 7/2007 | Abbadie et al. | 134/2 |
| 7,250,357 | B2* | 7/2007 | Senda et al. | 438/478 |
| 7,459,374 | B2* | 12/2008 | Aulnette et al. | 438/455 |
| 7,682,952 | B2* | 3/2010 | Isaacson et al. | 438/493 |
| 7,901,968 | B2* | 3/2011 | Weeks et al. | 438/41 |
| 2005/0148161 | A1* | 7/2005 | Chen et al. | 438/478 |
| 2006/0214257 | A1* | 9/2006 | Ninomiya et al. | 257/502 |
| 2009/0090933 | A1* | 4/2009 | Ninomiya et al. | 257/190 |
| 2009/0305485 | A1* | 12/2009 | Oka et al. | 438/478 |
| 2010/0003803 | A1* | 1/2010 | Oka et al. | 438/455 |

FOREIGN PATENT DOCUMENTS

| | | |
|---|---|---|
| JP | A-2000-513507 | 10/2000 |
| JP | A-2001-148473 | 5/2001 |
| JP | A-2003-142686 | 5/2003 |
| JP | A-2004-363510 | 12/2004 |
| JP | A-2006-173323 | 6/2006 |
| WO | WO 98/59365 | 12/1998 |
| WO | WO 2004/068556 A2 | 8/2004 |
| WO | WO 2004/086473 A1 | 10/2004 |
| WO | WO 2008/013032 * | 1/2008 |

OTHER PUBLICATIONS

Leitz, "A high throughput, ultra-low roughness, SiGe-free strained Si regrowth process," Materials Science in Semiconductor Processing, Oct. 2004, pp. 187-192, vol. 8, Elsevier Ltd., Great Britain.

Lee, "Growth of strained Si and strained Ge heterostructures on relaxed $Si_{1-x}Ge_x$ by ultrahigh vacuum chemical vapor deposition," Journal of Vacuum Science and Technology B: Microelectronics and Nanometer Structures, Jan./Feb. 2004, pp. 158-164, vol. 22, American Vacuum Society.

Abbadie, "Low thermal budget surface preparation of Si and SiGe," Applied Surface Science, Jan. 1, 2004, pp. 256-266, vol. 225, No. 1, Elsevier, B.V.

Westhoff, "A Novel, High Quality SiGe Graded Buffer Growth Process Using $GeCl_4$," $206^{th}$ Meeting of the Electrochemical Society, 2004, vol. 7, Electrochemical Society Inc., U.S.

Leitz, "Direct regrowth of thin strained silicon films on planarized relaxed silicon-germanium virtual substrates," Thin Solid Films, Mar. 3, 2006, pp. 300-306, vol. 513, Elsevier B.V.

Official Communication issued in European Patent Application No. 07 768 119.5 on Jul. 6, 2010.

* cited by examiner

METHOD FOR PRODUCING SEMICONDUCTOR SUBSTRATE

TECHNICAL FIELD

The present invention relates to a method for producing a semiconductor substrate, and more particularly to a method for producing a semiconductor substrate having a strained Si layer formed on a SiGe layer.

BACKGROUND ART

There is known a semiconductor substrate having a SiGe gradient composition layer formed on a Si substrate with Ge concentration therein increasing with the thickness, a SiGe constant composition layer with constant Ge concentration formed thereon, and another Si layer (strained Si layer) formed thereon (Hereinafter, the SiGe gradient composition layer and SiGe constant composition layer will be, if collectively referred to, termed "SiGe layer". A semiconductor substrate having such a structure may be hereinafter sometimes referred to as "strained Si substrate"). Since the SiGe layer has a larger lattice constant than the Si layer and expands the lattice constant of the Si layer thereby generating tensile strain, which in turn improves electron and hole mobility, application of such a substrate in electronic devices such as MOSFET (metal oxide semiconductor field effect transistor) is known to be effective in increasing their performance. However, conventional strained Si substrates had problems such as generation of dislocations due to the difference in lattice constant between the Si substrate and the SiGe layer, and generation of irregularities such as cross hatch patterns on the surface. A MOSFET fabricated using a strained Si substrate with such a strained Si layer of poor quality would exhibit performance that was not as improved as expected.

As a measure to solve such a problem, a published Japanese translation of PCT International Application No. 2000-513507 proposes a method in which irregularities on the surface of a SiGe layer are flattened by CMP (chemical mechanical polishing) or the like and a strained Si layer is grown on the flattened surface of the SiGe layer.

However, when epitaxially growing a strained Si layer on the surface of a SiGe layer that has been flattened by CMP or the like as in this case, there was a problem that surface flatness of the strained Si layer may be degraded.

DISCLOSURE OF THE INVENTION

The present invention was made in consideration of such a problem and its object is to achieve an epitaxial growth of a strained Si layer on a flattened SiGe layer, while suppressing flatness degradation of the SiGe layer surface and increase in dislocation density.

The invention was made to achieve the above object and provides a method for producing a semiconductor substrate, including at least steps of:

forming a SiGe gradient composition layer having a Ge concentration increasing with thickness toward a surface thereof on a Si single crystal substrate;

forming a SiGe constant composition layer having a constant Ge concentration on the SiGe gradient composition layer;

flattening a surface of the SiGe constant composition layer;
removing a natural oxide film on the flattened surface of the SiGe constant composition layer; and forming a strained Si layer on the surface of the SiGe constant composition layer from which the natural oxide film has been removed, wherein the formation of the SiGe gradient composition layer and the formation of the SiGe constant composition layer are performed at a temperature $T_1$ that is higher than 800° C., the removal of the natural oxide film from the surface of the SiGe constant composition layer is performed in a reducing atmosphere through a heat treatment at a temperature $T_2$ that is equal to or higher than 800° C. and lower than the temperature $T_1$, and the formation of the strained Si layer is performed at a temperature $T_3$ that is lower than the temperature $T_1$.

In this method for producing a semiconductor substrate of a strained Si substrate having a strained Si layer formed on a SiGe layer, the formation of the SiGe gradient composition layer and the formation of the SiGe constant composition layer are performed at a temperature $T_1$ that is higher than 800° C., the removal of the natural oxide film from the surface of the SiGe constant composition layer is performed in a reducing atmosphere through a heat treatment at a temperature $T_2$ that is equal to or higher than 800° C. and lower than the temperature $T_1$, and the formation of the strained Si layer is performed at a temperature $T_3$ that is lower than the temperature $T_1$, so that relaxation of the SiGe gradient composition layer and SiGe constant composition layer, which involves dislocations and which is caused by the heat treatment when removing the natural oxide film and the heat treatment when forming the strained Si layer, is suppressed, and also, degradation of flatness of the surface of the SiGe constant composition layer on which the strained Si layer is grown (or the interface between the SiGe constant composition layer and the strained Si layer) is suppressed. Therefore, a strained Si substrate having a strained Si layer formed on such a SiGe constant composition layer with a good surface flatness can be obtained.

In this case, preferably, there should be a temperature difference between the temperature $T_1$ and the temperature $T_2$ and a temperature difference between the temperature $T_1$ and the temperature $T_3$ are 50° C. or more, respectively.

With the temperature difference between the temperature $T_1$ and the temperature $T_2$ and a temperature difference between the temperature $T_1$ and the temperature $T_3$ are 50° C. or more, respectively, as described above, the relaxation of the SiGe gradient composition layer and SiGe constant composition layer that involves dislocations, and degradation of surface (interface) flatness of the SiGe constant composition layer can be prevented more reliably.

The formation of the SiGe gradient composition layer and the formation of the SiGe constant composition layer should preferably be performed using either one of a mixed gas of dichlorosilane and germanium tetrachloride and a mixed gas of trichlorosilane and germanium tetrachloride.

Performing the formation of the SiGe gradient composition layer and SiGe constant composition layer using either a mixed gas of dichlorosilane and germanium tetrachloride or a mixed gas of trichlorosilane and germanium tetrachloride makes it possible to form the SiGe gradient composition layer and SiGe constant composition layer while suppressing wall deposition which precipitates inside the growing container, or generation of particles on the growing substrate surface, even at a high temperature exceeding 800° C.

The removal of the natural oxide film from the surface of the SiGe constant composition layer should preferably be performed in a hydrogen atmosphere under reduced pressure. Also preferably, after the step of removing the natural oxide film from the surface of the SiGe constant composition layer, a Si cap layer should be formed on the surface of the SiGe constant composition layer, from which the natural oxide film has been removed.

Performing the removal of the natural oxide film from the surface of the SiGe constant composition layer in a hydrogen atmosphere under reduced pressure can increase the efficiency of the removal of the natural oxide film. Also, after the step of removing the natural oxide film from the surface of the SiGe constant composition layer, by forming a Si cap layer on the surface of the SiGe constant composition layer, from which the natural oxide film has been removed, degradation of surface flatness of the SiGe constant composition layer after the natural oxide film has been removed can be prevented more effectively.

In this case, the Si cap layer formed on the surface of the SiGe constant composition layer should preferably be formed using one of the following gasses: monosilane, dichlorosilane, trichlorosilane, a mixed gas of dichlorosilane and hydrogen chloride, and a mixed gas of trichlorosilane and hydrogen chloride.

By forming the Si cap layer formed on the surface of the SiGe constant composition layer using one of the following gasses: monosilane, dichlorosilane, trichlorosilane, a mixed gas of dichlorosilane and hydrogen chloride, and a mixed gas of trichlorosilane and hydrogen chloride, the Si cap layer formed on the surface of the SiGe constant composition layer can be formed with an extremely small thickness.

According to the method for producing a semiconductor substrate of the present invention, a strained Si substrate having a strained Si layer with good crystal quality such as surface flatness can be produced. With the use of such a strained Si substrate, an electronic device such as MOSFET with higher quality can be fabricated with a good yield.

BEST MODE FOR CARRYING OUT THE INVENTION

The present invention will be hereinafter described in more detail.

As mentioned above, when epitaxially growing a strained Si layer on the surface of a SiGe constant composition layer that has been flattened by CMP or the like, there was a problem that surface flatness of the strained Si layer is sometimes degraded.

With regard to such a problem, the present inventors conducted rigorous experiments and studies based on an assumption that a large cause of the problem is the heat treatment in the step of removing the natural oxide film and in the step of epitaxially growing the strained Si layer, as it introduces dislocations in the SiGe layer and degrades the flatness of the surface of the SiGe layer (or the SiGe/strained Si interface after growth of the strained Si layer has started).

As a result, the present inventors found out that performing the heat treatments such as the step of removing the natural oxide film and the step of epitaxially growing the strained Si layer at high temperatures led to degradation of the above-mentioned crystal quality or surface flatness of the SiGe layer, and that reducing the temperatures during these heat treatments could basically resolve the problem.

However, if the temperature of the heat treatment for the removal of the natural oxide film is lower than 800° C., it will take longer to remove the natural oxide film, which is inefficient, and the natural oxide film cannot be removed sufficiently, which will lead to a problem that the quality of the strained Si layer is lowered. In practice, therefore, it is necessary to perform the step of removing the natural oxide film at least at 800° C. or more.

Accordingly, the present inventors conducted experiments and studies to find out a method for preventing degradation of crystal quality and surface flatness of the SiGe layer even when the step of removing the natural oxide film is performed at 800° C. or more.

As a result, the present inventors found out that the SiGe layer should be preliminarily formed at a temperature that is higher than that of the heat treatments for the removal of the natural oxide film or other steps, thus completing the present invention.

The present invention will be hereinafter described in more concrete terms with reference to the drawings, but the present invention is not limited to those described below.

Figure 1:
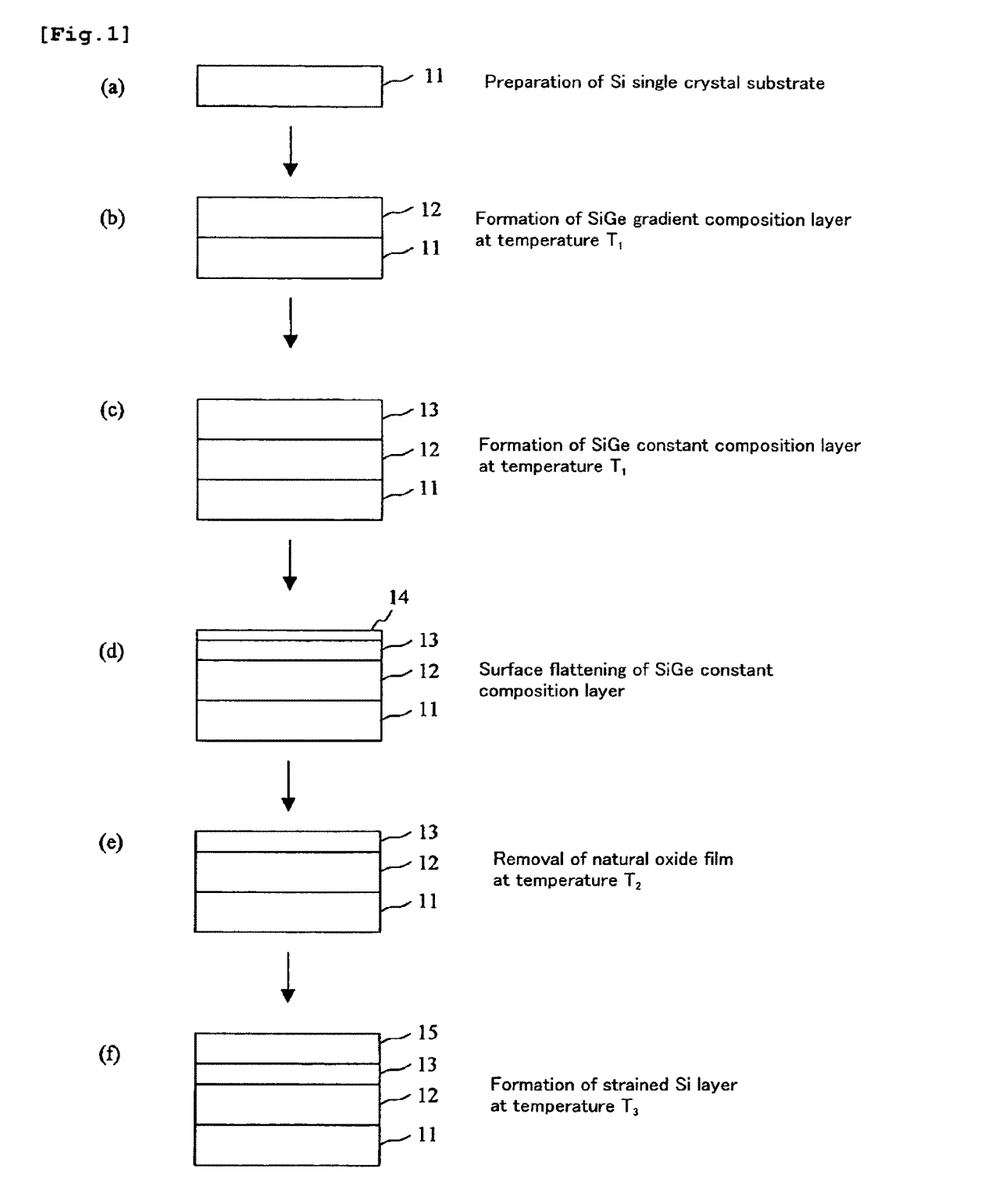
FIG. 1 is a flowchart showing a method for producing a semiconductor substrate according to the present invention.

FIG. 1 is a flowchart schematically showing a method for producing a semiconductor substrate according to the present invention.

First, a Si single crystal substrate 11 is prepared (FIG. 1(a)). It is desirable that the Si single crystal substrate 11 should have as flat a surface as possible.

The Si single crystal substrate 11 may have been produced by any production methods. For example, they may be those that have been produced by a CZ method or an FZ method. They may have any surface plane orientation, i.e., the substrate may be suitably selected in accordance with the purpose of use.

Next, a SiGe gradient composition layer 12 is grown on the surface of the Si single crystal substrate 11 (FIG. 1(b)), after which a SiGe constant composition layer 13 is grown on the surface of this SiGe gradient composition layer 12 (FIG. 1(c)). Note, the formation of this SiGe gradient composition layer 12 and the formation of the SiGe constant composition layer 13 are performed at a temperature $T_1$ that is higher than 800° C. The temperature when forming the SiGe gradient composition layer 12 may be different from the temperature when forming the SiGe constant composition layer 13.

The SiGe gradient composition layer 12 and the SiGe constant composition layer 13 may be formed by transferring the Si single crystal substrate 11 into a chamber of a vapor phase growing apparatus and supplying a Si compound gas and a Ge compound gas as process gasses into the chamber so as to achieve epitaxial growth by a vapor phase reaction. The SiGe gradient composition layer 12 has a Ge concentration that increases towards the surface with the thickness. Such a SiGe gradient composition layer may be formed, for example, by gradually increasing the ratio of the Ge compound gas supplied into the chamber.

For the formation of the SiGe gradient composition layer 12 and the SiGe constant composition layer 13 at a temperature $T_1$ exceeding 800° C., the process gas should preferably be a mixed gas of dichlorosilane ($SiH_2Cl_2$; DCS) and germanium tetrachloride ($GeCl_4$) for the following reasons:

When forming a SiGe layer, usually, a combination of monosilane ($SiH_4$) and monogermane ($GeH_4$) is used as the process gas. Such a gas may be used also in the method for producing a semiconductor substrate of the present invention, but since the decomposition temperature of monosilane gas and monogermane gas is about 500° C. or less, they can easily decompose and precipitate under the temperature condition exceeding 800° C., which is the condition according to the present invention, because of which more particles tend to be formed on the growing substrate surface, as well as precipitation inside the growing container, i.e., so-called "wall deposition", tends to occur more often.

In contrast, since dichlorosilane and germanium tetrachloride have a high decomposition temperature, the SiGe layer growth on the growing substrate surface is more easily controllable even at a temperature exceeding 800° C. Therefore, it is preferable to use a mixed gas of dichlorosilane and germanium tetrachloride. It is even more preferable to use the above combination of dichlorosilane and germanium tetrachloride if the growing temperature is set even higher, for example, to 1000° C. or more.

The process gas used for the formation of the SiGe layer may be a mixed gas of trichlorosilane ($SiHCl_3$; TCS) and germanium tetrachloride instead of the mixed gas of dichlorosilane and germanium tetrachloride. The above effect will also be achieved if a mixed gas of dichlorosilane, trichlorosilane, and germanium tetrachloride is used.

After the formation of the SiGe constant composition layer 13 in the step (c), an extremely thin Si layer (Si protective layer) with a thickness of, for example, about several to ten and several nm or less may be formed (not shown) on the surface of the SiGe constant composition layer 13. Such a Si protective layer may be formed, for example, following the formation of the SiGe constant composition layer 13 above, by stopping the supply of the Ge compound into the chamber and by supplying a Si compound gas. Alternatively, other than Si, the protective layer may be formed of $SiO_2$.

The higher the concentration of, in particular, Ge, of the SiGe layer is, the more likely it is that a heat treatment causes generation of a cross hatch pattern on the surface so as to relax the stress in the SiGe layer. The generation of such a cross hatch pattern can be suppressed by capping the active SiGe surface with Si or $SiO_2$ as described above, which will reduce irregularities, though slightly, to alleviate the load of flattening treatment and to shorten the treatment time.

The Si protective layer formed here will be removed during the flattening treatment in a step (e) which will be described later. The Si protective layer is different from a Si cap layer to be described later.

Next, surface flattening is performed (FIG. 1(d)), followed by cleaning, as required.

The surface flattening may be achieved by any method with which a good surface flatness can be obtained. A method using CMP is preferable as it is an easy method and yet provides a SiGe layer surface with a very high flatness.

In this surface flattening step and a cleaning step afterwards, a thin natural oxide film 14 is formed.

When a Si protective layer has been formed on the SiGe constant composition layer 13 after the formation thereof in the step (c) as mentioned above, this Si protective layer is removed during this surface flattening step.

Next, the semiconductor substrate having the SiGe layer that has been surface-flattened in the step (d) is transferred into a chamber of a vapor phase growing apparatus. This vapor phase growing apparatus may be the same one as that used for the formation of the SiGe layer above, or not. Transfer into the vapor phase growing apparatus is carried out swiftly in order to suppress growth of the natural oxide film as much as possible. Afterwards, the semiconductor substrate is not taken out from this chamber until after the formation of a strained Si layer in a step (f) is complete.

Next, the natural oxide film 14 is removed (FIG. 1(e)). More specifically, the removal of the natural oxide film is achieved through a heat treatment in a reducing atmosphere such as hydrogen at a temperature $T_2$, which is equal to or higher than 800° C., and lower than the temperature $T_1$ during the formation of the SiGe gradient composition layer and the formation of the SiGe constant composition layer in the steps (b) and (c). Heating in a reducing atmosphere as described above reduces the natural oxide film and removes the same. If the temperature during the formation of the SiGe gradient composition layer in the step (b) is set differently from the temperature during the formation of the SiGe constant composition layer in the step (c), the temperature $T_2$ in the step (d) is set lower than both of the temperatures in the steps (b) and (c).

Performing the heat treatment as described above for the removal of the natural oxide film at the temperature $T_2$ that is lower than the temperature $T_1$ at which the SiGe layer was formed prevents the SiGe layer from relaxing during the step of removing the natural oxide film, and prevents degradation of the surface flatness caused thereby. At this time, it is preferable to set the temperature $T_2$ lower than the temperature $T_1$ by 50° C. or more, because the degradation of the surface flatness of the SiGe layer is then prevented more reliably.

The reason why the heat treatment temperature $T_2$ for the removal of the natural oxide film is set 800° C. or more is that, if the temperature is lower than that, it is inefficient as it will take too much time for removing the natural oxide film, and that it is necessary to set so to sufficiently remove the natural oxide film.

Here, it is preferable to perform the treatment in a hydrogen atmosphere under reduced pressure, as the reducing atmosphere. The reason for the pressure reduction is to increase efficiency of, and to ensure, the removal of the natural oxide film.

Next, the strained Si layer is grown. Before that, a thin Si cap layer of about several nm thickness may be formed (not shown) on the surface of the SiGe constant composition layer. This Si cap layer may be grown by flowing in a Si compound gas to achieve epitaxial growth, but to form a thin film, it is preferable to use monosilane, dichlorosilane, trichlorosilane or the like, as it is then easier to control the growth rate. For the formation of the Si cap layer, hydrogen chloride may be mixed, i.e., a mixed gas of dichlorosilane and hydrogen chloride, or a mixed gas of trichlorosilane and hydrogen chloride may be used. The temperature when forming this Si cap layer is also lower than the temperature $T_1$.

By thus forming the Si cap layer on the surface of the SiGe layer, degradation of the surface flatness of the SiGe layer is prevented, which is caused by exposure of the SiGe layer surface from which the natural oxide film has been removed in the high-temperature hydrogen atmosphere during a period before the growth of the strained Si layer.

Next, the strained Si layer 15 is formed on the SiGe constant composition layer 13, or on the Si cap layer described above (FIG. 1(f)). Once the strained Si layer 15 is formed in the step (f), the above Si cap layer is integrated with the strained Si layer 15. That is, in such a case, too, the strained Si layer 15 is formed on the SiGe constant composition layer 13.

The strained Si layer 15 is formed by supplying a Si compound such as monosilane into the chamber of the vapor phase growing apparatus to cause epitaxial growth at a temperature $T_3$ that is lower than the temperature $T_1$ at which the SiGe layer was formed. At this time, similarly to the temperature $T_2$, it is preferable to set the temperature $T_3$ lower than the temperature $T_1$ by 50° C. or more, because the degradation of the surface flatness of the SiGe layer is then prevented more reliably.

Thickness of the strained Si layer 15 may be set variously depending on the purpose of use; for example, it may be about several tens to several hundreds nm. The formation of the strained Si layer 15 having such a thickness can be performed efficiently at a relatively low temperature of, for example, about 500° C. to 700° C., using monosilane, but the invention is not limited to this. As long as the temperature $T_3$ is lower than the temperature $T_1$, the formation may be performed using dichlorosilane or the like, at a temperature of about 800° C. or more, for example.

In this step of forming the strained Si layer, too, since the temperature is maintained lower than $T_1$, relaxation of the SiGe layer that involves dislocations and flatness degradation of SiGe/Si interface can be prevented.

As described above, forming the SiGe gradient composition layer 12 and the SiGe constant composition layer 13 at the temperature $T_1$ that is higher than 800° C. and performing the steps afterwards with the temperature being maintained lower than $T_1$ can suppress relaxation of the SiGe layer that involves dislocations and flatness degradation of surface (interface), whereby the strained Si layer 15 can be formed with good crystal quality.

EXAMPLES

Examples of the present invention and comparative examples will be shown below to describe the invention in more concrete times, but the invention should not be limited to these examples.

Example 1

A Si single crystal substrate 11 produced by a CZ method with a plane orientation of {100} was prepared (a). This Si single crystal substrate was transferred into a single wafer processing CVD apparatus, and a SiGe layer was epitaxially grown, using dichlorosilane and germanium tetrachloride as the process gas at 1000° C. and 80 torr (about 11 kPa) under the following conditions: The supply amount of dichlorosilane was constant at 200 sccm, while the supply amount of germanium tetrachloride was increased from 0 g/min to 0.6 g/min so as to grow a 2 μm thick SiGe gradient composition layer 12 (b) in which Ge concentration gradually increases from 0% up to 21%. Then, the supply amount of dichlorosilane and germanium tetrachloride was set 200 sccm and 0.6 g/min, respectively, to grow thereon a 2 μm thick SiGe constant composition layer 13 (c) in which Ge concentration is constant at 21%. Afterwards, the supply of germanium tetrachloride was stopped while dichlorosilane alone was supplied, so as to form a 10 nm thick Si protective layer.

The surface flatness of the semiconductor substrate at this time was such that the RMS (Root Mean Square) roughness in a measurement area of 30 μm×30 μm was 2.5 nm, due to irregularities including a cross hatch pattern on the surface.

CMP was performed to this semiconductor substrate with a stock removal of about 200 nm (d). As a result, the surface flatness of the SiGe constant composition layer improved such that the RMS roughness was 0.13 nm. Haze measurement of the entire SiGe constant composition layer surface of this semiconductor substrate using a particle measuring system confirmed that a good result was obtained. The measurement result was substantially the same as the case with Comparative Example 1 (FIG. 2) to be described later.

The semiconductor substrate that has thus undergone CMP was cleaned with dilute hydrofluoric acid (DHF), and was swiftly transferred into a CVD apparatus. Next, the substrate was heated to 810° C. in a hydrogen atmosphere (50 torr) to reduce and remove the natural oxide film 14 (e) formed during the step (d). Successively, with the temperature being maintained at 810° C., a mixed gas of dichlorosilane and hydrogen chloride was flowed into the chamber to form a thin Si protective layer. Next, the temperature was lowered down to 650° C., and monosilane was supplied into the chamber, so as to grow a 70 nm thick strained Si layer 15 (f).

Figure 3:
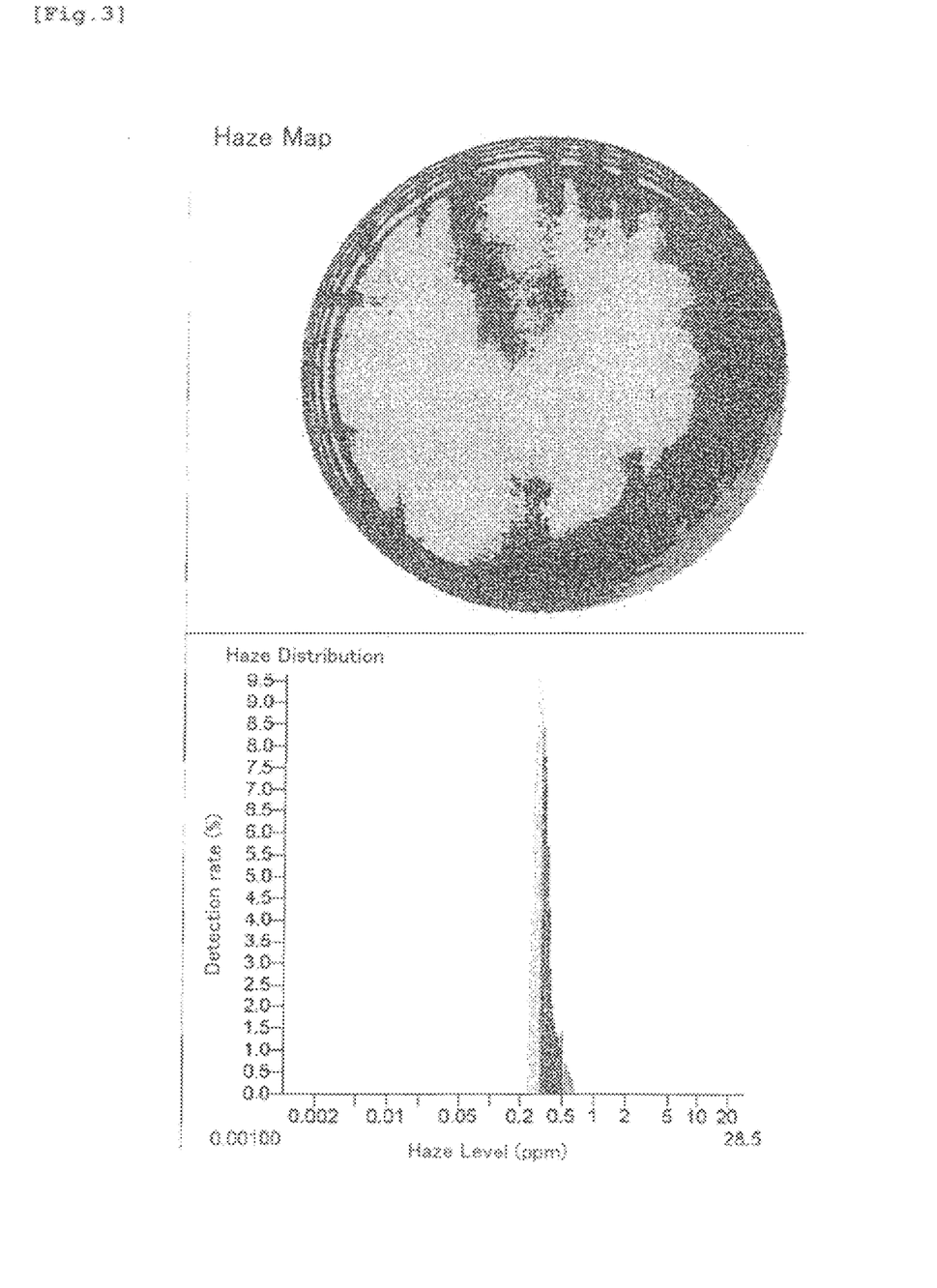
FIG. 3 is an image of haze on the surface of a strained Si layer measured after the formation of the strained Si layer according to an example of the invention.

The surface flatness of the strained Si layer 15 of the thus produced strained Si substrate was measured, and the RMS roughness was 0.13 nm, which was a particularly good value. FIG. 3 shows a result of measurement of haze on the entire strained Si layer surface using a particle measuring system, with a result that no cross hatch pattern was observed.

The strained Si layer thus had a good surface flatness, with the effect of the present invention having been clearly achieved.

Example 2

A semiconductor substrate similarly processed as Example 1 to the CMP step was cleaned with diluted hydrofluoric acid and transferred into a CVD apparatus. Next, the substrate was heated to 900° C. in a hydrogen atmosphere (ordinary pressure) to remove the natural oxide film 14. Successively, without forming a Si cap layer, monosilane was supplied into the chamber at a temperature of 650° C. so as to form a strained Si layer.

The surface flatness of the strained Si layer 15 of the thus produced strained Si substrate was measured, and the RMS roughness was 0.22 nm, which was a relatively good value. Haze on the entire strained Si layer surface was measured using a particle measuring system, with a result that no cross hatch pattern was observed.

The strained Si layer thus had a good surface flatness even though no Si cap layer was formed on the SiGe layer after removing the natural oxide film 14.

Example 3

A semiconductor substrate similarly processed as Example 1 to the CMP step was cleaned with diluted hydrofluoric acid and transferred into a CVD apparatus. Next, the substrate was heated to 900° C. in a hydrogen atmosphere (ordinary pressure) to remove the natural oxide film 14. Successively, without forming a Si cap layer, dichlorosilane was supplied into the chamber at a temperature of 800° C. so as to form a strained Si layer.

The surface flatness of the strained Si layer 15 of the thus produced strained Si substrate was measured, and the RMS roughness was 0.21 nm, which was a relatively good value. Haze on the entire strained Si layer surface was measured using a particle measuring system, with a result that no cross hatch pattern was observed.

A substrate having a strained Si layer with a good surface flatness was thus obtained, even though the strained Si layer was formed at a relatively high temperature of 800° C.

Comparative Example 1

A Si single crystal substrate produced by a CZ method with a plane orientation of {100} was prepared. This Si single crystal substrate was transferred into a single wafer processing CVD apparatus, and a SiGe layer was epitaxially grown, using dichlorosilane and monogermane as the process gas at 800° C. and 80 torr (about 11 kPa) under the following conditions: The supply amount of dichlorosilane was constant at 300 sccm, while the supply amount of monogermane was increased from 0 sccm to 200 sccm so as to grow a 2 µm thick SiGe gradient composition layer in which Ge concentration gradually increases from 0% up to 18%. Then, the supply amount of dichlorosilane and monogermane was set 300 sccm and 200 sccm, respectively, to grow thereon a 2 µm thick SiGe constant composition layer 13 in which Ge concentration is constant at 18%. Afterwards, the supply of monogermane was stopped while dichlorosilane alone was supplied, so as to form a 10 nm thick Si protective layer.

The surface flatness of the semiconductor substrate at this time was such that the RMS roughness in a measurement area of 30 µm×30 µm was 1.73 nm, due to irregularities including a cross hatch pattern on the surface.

Figure 2:
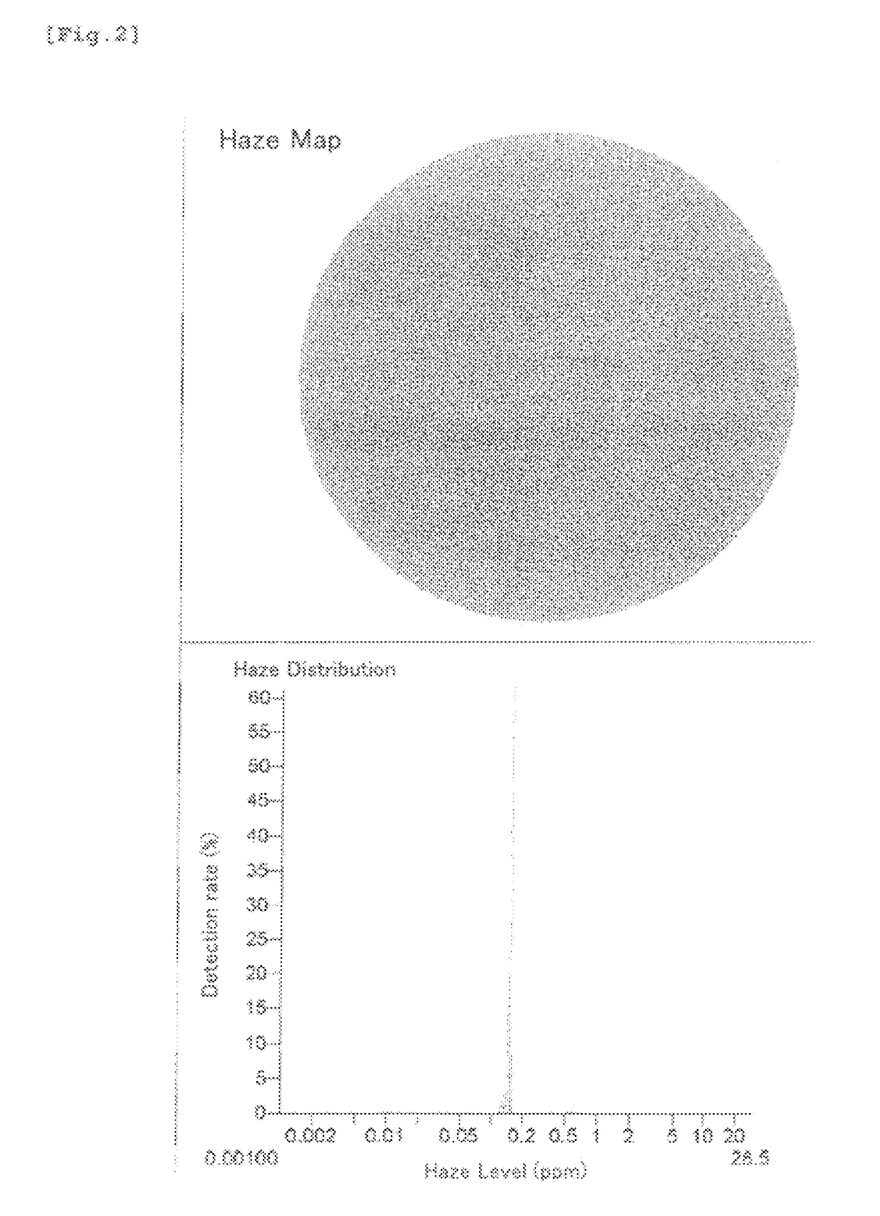
FIG. 2 is an image of haze on the surface of a SiGe layer measured after a flattening treatment.

CMP was performed to this semiconductor substrate with a stock removal of about 200 nm. As a result, the surface flatness of the SiGe constant composition layer improved such that the RMS roughness was 0.13 nm. FIG. 2 shows a result of measurement using a particle measuring system of haze on the entire SiGe constant composition layer surface of this semiconductor substrate. The result confirmed that the substrate had a good surface flatness.

The semiconductor substrate that has thus undergone CMP was cleaned with dilute hydrofluoric acid (DHF), and was swiftly transferred into a CVD apparatus. Next, the substrate was heated to 810° C. in a hydrogen atmosphere (50 torr) to reduce and remove the natural oxide film formed during the CMP step. Successively, with the temperature being maintained at 810° C., a mixed gas of dichlorosilane and hydrogen chloride was flowed into the chamber to form a thin Si protective layer. Next, the temperature was lowered down to 650° C., and monosilane was supplied into the chamber, so as to grow a 70 nm thick strained Si layer.

Figure 4:
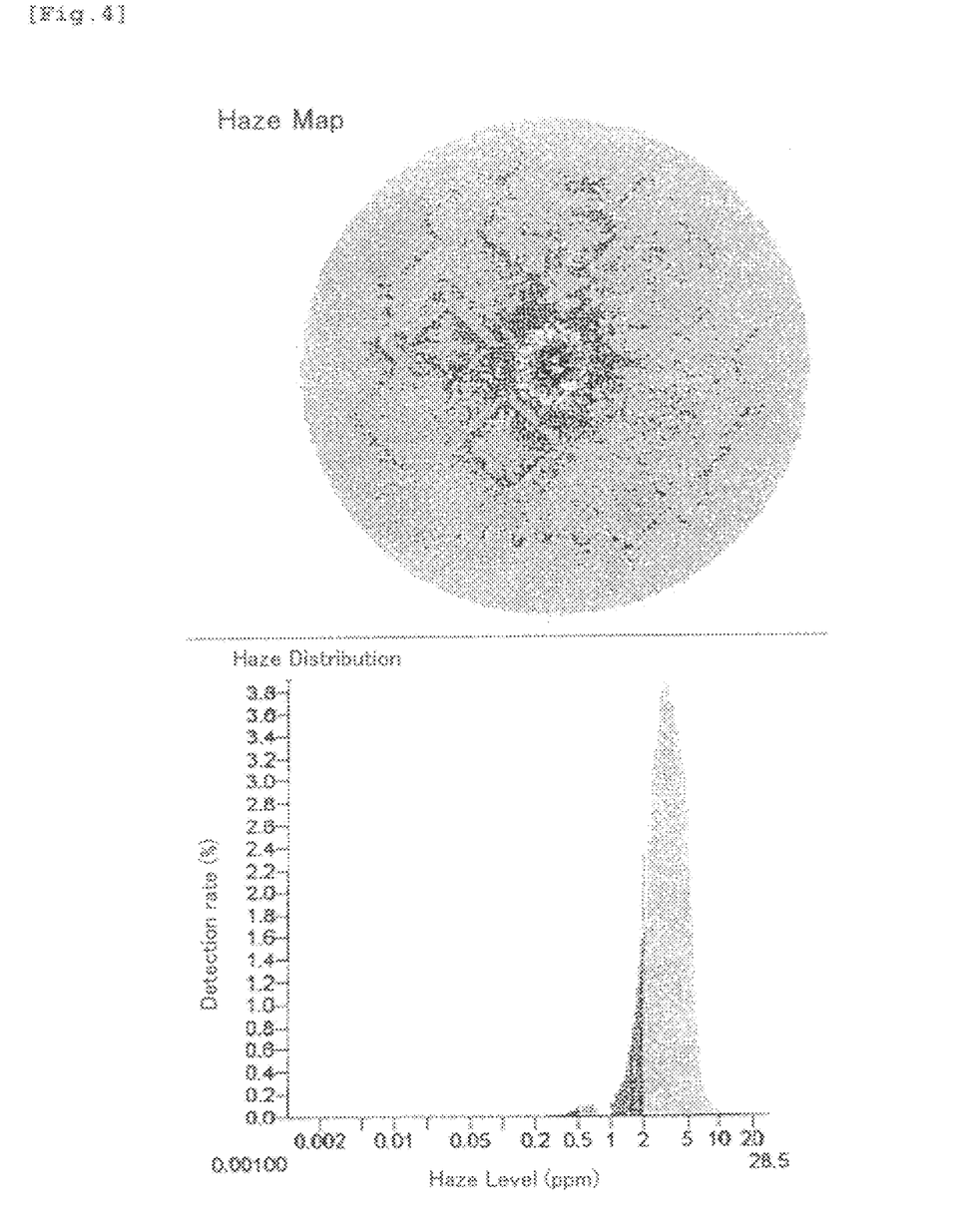
FIG. 4 is an image of haze on the surface of a strained Si layer measured after the formation of the strained Si layer according to a comparative example.

The surface flatness of the strained Si layer 15 of the thus produced strained Si substrate was measured, and the RMS roughness was 0.21 nm, which was a relatively good value but not as good as that of Example 1 in which a Si cap layer was similarly formed. FIG. 4 shows a result of measurement using a particle measuring system of haze on the entire strained Si layer surface. The result showed that a huge cross hatch pattern was observed over the entire region on the strained Si layer surface.

As demonstrated above, it can be seen that the surface flatness of the strained Si layer has degraded, as compared to Example 1 in which a Si cap layer was similarly formed.

Comparative Example 2

A semiconductor substrate similarly processed as Comparative Example 1 to the CMP step was cleaned with diluted hydrofluoric acid and transferred into a CVD apparatus. Next, the substrate was heated to 810° C. in a hydrogen atmosphere (50 torr) to remove the natural oxide film. Successively, without forming a Si cap layer, monosilane was supplied into the chamber at a temperature of 650° C. so as to form a strained Si layer.

The surface flatness of the strained Si layer of the thus produced strained Si substrate was measured, and the RMS roughness was 0.43 nm. Haze on the entire strained Si layer surface was measured using a particle measuring system, with a result that a huge cross hatch pattern was observed over the entire surface of the strained Si layer, similarly to Comparative Example 1.

As demonstrated above, it can be seen that the surface flatness of the strained Si layer has degraded, as compared to Examples 2 and 3 in which, similarly, no Si cap layer was formed.

Comparative Example 3

A semiconductor substrate similarly processed as Comparative Example 1 to the CMP step was cleaned with diluted hydrofluoric acid and transferred into a CVD apparatus. Next, the substrate was heated to 900° C. in a hydrogen atmosphere (ordinary pressure) to remove the natural oxide film. Successively, without forming a Si cap layer, monosilane was supplied into the chamber at a temperature of 650° C. so as to form a strained Si layer.

The surface flatness of the strained Si layer of the thus produced strained Si substrate was measured, and the RMS roughness was 0.39 nm. Haze on the entire strained Si layer surface was measured using a particle measuring system, with a result that a huge cross hatch pattern was observed over the entire surface of the strained Si layer, similarly to Comparative Example 1.

As demonstrated above, it can be seen that the surface flatness of the strained Si layer has degraded, as compared to Examples 2 and 3 in which, similarly, no Si cap layer was formed.

The semiconductor substrate production conditions and results of Examples 1 to 3 and Comparative Examples to 3 are shown respectively in Table 1 and Table 2.

"DCS" in Table 1 represents dichlorosilane.

TABLE 1

| Sample | Formation of SiGe gradient composition layer and SiGe constant composition layer | Removal of natural oxide film | Formation of Si cap layer | Formation of strained Si layer |
| --- | --- | --- | --- | --- |
| Example 1 | 1000° C. Dichlorosilane/ Germanium tetrachloride | 810° C. Hydrogen | 810° C. DCS/Hydrogen chloride | 650° C. Monosilane |
| Example 2 | | 900° C. Hydrogen | None | 650° C. Monosilane |
| Example 3 | | 900° C. Hydrogen | None | 800° C. Dichlorosilane |
| Comparative Example 1 | 800° C. Dichlorosilane/ Monogermane | 810° C. Hydrogen | 810° C. DCS/Hydrogen chloride | 650° C. Monosilane |
| Comparative Example 2 | | 810° C. Hydrogen | None | 650° C. Monosilane |
| Comparative Example 3 | | 900° C. Hydrogen | None | 650° C. Monosilane |

TABLE 2

| Sample | RMS roughness | Cross hatch pattern |
|---|---|---|
| Example 1 | 0.13 nm | None |
| Example 2 | 0.22 nm | None |
| Example 3 | 0.21 nm | None |
| Comparative Example 1 | 0.21 nm | Present |
| Comparative Example 2 | 0.43 nm | Present |
| Comparative Example 3 | 0.39 nm | Present |

The above results have made it clear that, according to the method for producing a semiconductor substrate of the present invention in which temperatures of various heat treatment steps are respectively controlled, a strained Si substrate having a strained Si layer with a good surface flatness can be obtained.

It should be noted that the present invention is not limited to the embodiments described above which have been shown for illustrative purpose only, and that those having substantially the same configuration as the technical idea as set forth in the claims of the present invention and providing similar effects should all be included in the technical scope of the present invention.

The invention claimed is:

1. A method for producing a semiconductor substrate, comprising at least steps of:
    forming a SiGe gradient composition layer having a Ge concentration increasing with thickness toward a surface thereof on a Si single crystal substrate;
    forming a SiGe constant composition layer having a constant Ge concentration on the SiGe gradient composition layer;
    flattening a surface of the SiGe constant composition layer;
    removing a natural oxide film on the flattened surface of the SiGe constant composition layer; and
    forming a strained Si layer on the surface of the SiGe constant composition layer from which the natural oxide film has been removed, wherein
    the formation of the SiGe gradient composition layer and the formation of the SiGe constant composition layer are performed at a temperature $T_1$ that is higher than 800° C.,
    the removal of the natural oxide film from the surface of the SiGe constant composition layer is performed in a reducing atmosphere through a heat treatment at a temperature $T_2$ that is equal to or higher than 800° C. and lower than the temperature $T_1$,
    the formation of the strained Si layer is performed using monosilane at a temperature $T_3$ of 500° C. to 700° C., and
    after the step of removing the natural oxide film from the surface of the SiGe constant composition layer and before the growth of the strained Si layer, a Si cap layer is formed on the surface of the SiGe constant composition layer, from which the natural oxide film has been removed, at a temperature lower than the temperature $T_1$.

2. The method for producing a semiconductor substrate according to claim 1, wherein a temperature difference between the temperature $T_1$ and the temperature $T_2$ is 50° C. or more.

3. The method for producing a semiconductor substrate according to claim 2, wherein the formation of the SiGe gradient composition layer and the formation of the SiGe constant composition layer are performed using either one of a mixed gas of dichlorosilane and germanium tetrachloride and a mixed gas of trichlorosilane and germanium tetrachloride.

4. The method for producing a semiconductor substrate according to claim 3, wherein the removal of the natural oxide film from the surface of the SiGe constant composition layer is performed in a hydrogen atmosphere under reduced pressure.

5. The method for producing a semiconductor substrate according to claim 2, wherein the removal of the natural oxide film from the surface of the SiGe constant composition layer is performed in a hydrogen atmosphere under reduced pressure.

6. The method for producing a semiconductor substrate according to claim 1, wherein the formation of the SiGe gradient composition layer and the formation of the SiGe constant composition layer are performed using either one of a mixed gas of dichlorosilane and germanium tetrachloride and a mixed gas of trichlorosilane and germanium tetrachloride.

7. The method for producing a semiconductor substrate according to claim 6, wherein the removal of the natural oxide film from the surface of the SiGe constant composition layer is performed in a hydrogen atmosphere under reduced pressure.

8. The method for producing a semiconductor substrate according to claim 1, wherein the removal of the natural oxide film from the surface of the SiGe constant composition layer is performed in a hydrogen atmosphere under reduced pressure.

9. The method for producing a semiconductor substrate according to claim 1, wherein the Si cap layer formed on the surface of the SiGe constant composition layer is formed using one of gasses selected from the group consisting of monosilane, dichlorosilane, trichlorosilane, a mixed gas of dichlorosilane and hydrogen chloride, and a mixed gas of trichlorosilane and hydrogen chloride.

* * * * *